(12) United States Patent
Kang et al.

(10) Patent No.: US 7,698,615 B2
(45) Date of Patent: Apr. 13, 2010

(54) SEMICONDUCTOR MEMORY DEVICE HAVING SINGLE-LEVEL CELLS AND MULTI-LEVEL CELLS AND METHOD OF DRIVING THE SEMICONDUCTOR MEMORY DEVICE

(75) Inventors: Eun-suk Kang, Suwon-si (KR); Young-joon Choi, Seongnam-si (JP); Sang-kil Lee, Suwon-si (KR); Dae-hyun Lee, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 364 days.

(21) Appl. No.: 11/891,991

(22) Filed: Aug. 14, 2007

(65) Prior Publication Data

US 2008/0141100 A1 Jun. 12, 2008

(30) Foreign Application Priority Data

Dec. 6, 2006 (KR) .................. 10-2006-0123379

(51) Int. Cl.
*H03M 13/00* (2006.01)
(52) U.S. Cl. .............. 714/746; 365/201.03; 365/201.09
(58) Field of Classification Search ................ 714/746; 365/201.03, 201.09
See application file for complete search history.

(56) References Cited

U.S. PATENT DOCUMENTS

| 5,937,423 | A * | 8/1999 | Robinson .................. 711/103 |
| 6,304,485 | B1 * | 10/2001 | Harari et al. ........... 365/185.09 |
| 6,353,553 | B1 | 3/2002 | Tamada et al. |
| 6,459,635 | B1 * | 10/2002 | Mullarkey et al. .......... 365/201 |
| 6,728,133 | B2 * | 4/2004 | Shimizu ................. 365/185.03 |
| 6,870,774 | B2 * | 3/2005 | Roohparvar et al. ... 365/185.33 |
| 6,914,846 | B2 * | 7/2005 | Harari et al. ........... 365/230.03 |
| 6,947,322 | B2 | 9/2005 | Anzai et al. |
| 7,405,976 | B2 * | 7/2008 | Hebishima ............. 365/185.22 |
| 7,460,399 | B1 * | 12/2008 | Harari et al. ........... 365/185.04 |
| 7,464,315 | B2 * | 12/2008 | Ito et al. ..................... 714/754 |
| 2004/0114430 | A1 | 6/2004 | Anzai et al. |

FOREIGN PATENT DOCUMENTS

| JP | 11-31102 | 2/1999 |
| JP | 2001-210082 | 8/2001 |
| JP | 2004-127481 | 4/2004 |

* cited by examiner

*Primary Examiner*—Esaw T Abraham
(74) *Attorney, Agent, or Firm*—Mills & Onello, LLP

(57) ABSTRACT

A semiconductor memory device that performs an error control operation when an error exists in an externally received command or an externally received address, and a method of driving the semiconductor memory device are provided. The semiconductor memory device includes a memory cell array having a single-level cell area and a multi-level cell area, a command decoder which receives a command from an external source and decoding the command, an area determination unit which receives an address from an external source and determines whether a memory cell corresponding to the address belongs to either the single-level cell area or the multi-level cell area, a command flag generation unit which generates at least one enable control signal according to the decoded command and the determination result, and a logic circuit which generates a control signal for driving the memory cells included in the memory cell array or performs an error control operation, in response to the enable control signal.

17 Claims, 8 Drawing Sheets

SEMICONDUCTOR MEMORY DEVICE HAVING SINGLE-LEVEL CELLS AND MULTI-LEVEL CELLS AND METHOD OF DRIVING THE SEMICONDUCTOR MEMORY DEVICE

CROSS-REFERENCE TO RELATED PATENT APPLICATION

This application claims the benefit of Korean Patent Application No. 10-2006-0123379, filed on Dec. 6, 2006, in the Korean Intellectual Property Office, the contents of which are incorporated herein in their entirety by reference.

BACKGROUND OF THE INVENTION

1. Field of the Invention

The present invention relates to a semiconductor memory device and a method of driving the semiconductor memory device, and more particularly, to a semiconductor memory device having single-bit cells and multi-bit cells, and a method of driving the semiconductor memory device, by which a malfunction or non-operation of the semiconductor memory device can be addressed.

2. Description of the Related Art

With the development of mobile systems and a variety of application systems, the demand for flash memory, which is a non-volatile type of memory, is increasing. A flash memory, which is an electrically erasable and programmable non-volatile memory device, can retain data even when no power is supplied. In particular, a NAND type flash memory device has a string structure in which a plurality of memory cells are serially connected to each other, and therefore is easily integrated and can be supplied at a low price. For this reason, NAND flash memory devices are used as data memory of a great variety of portable products.

With the development of flash memory devices and their related technology, a flash memory device that can store two or more bits in one memory cell is widely used. A single-level cell (SLC) is used to store one-bit data in one memory cell, and a multi-level cell (MLC) is used to store data corresponding to two or more bits in one memory cell.

FIG. 1A is a graph showing a data state in a single-level cell versus a threshold voltage. As shown in FIG. 1A, when storing one-bit data in the single-level cell, when a programmed threshold voltage is 1 to 3 V, the data stored in the single-level cell is logic"1", and when the programmed threshold voltage is 5 to 7 V, the data stored in the single-level cell is logic"0". Data stored in a memory cell is read out by detecting a variation in the current of the memory cell, which is caused due to a change of a threshold voltage.

FIG. 1B is a graph showing a data state in a multi-level cell versus a threshold voltage. As an example, a case where two-bit data is stored in one memory cell is illustrated. As shown in FIG. 1B, when storing two-bit data in a single multi-level cell, when a programmed threshold voltage is 1 to 3 V, data stored in the memory cell has a logic level of "11". When the programmed threshold voltage is 3.8 to 4.2 V, data stored in the memory cell has a logic level of "10". Also, when the programmed threshold voltage is 4.9 to 5.4 V, data stored in the memory cell has a logic level of "01". When the programmed threshold voltage is 6.5 to 7.0 V, data stored in the memory cell has a logic level of "00".

A memory cell included in a flash memory device can be used as a single-level cell for storing one bit or as a multi-level cell for storing data corresponding to two or more bits. Also, in a single flash memory device, some memory cells included therein are single-level cells and the remainder are multi-level cells.

When various types of memory cells, namely, single-level cells and multi-level cells, are used as memory cells of one flash memory device, the single-level cells and the multi-level cells are driven by different commands. That is, according to predetermined cell area information, some of the memory cells are set as single-level cells and the others are set as multi-level cells. Operations such as a program operation, a read operation, etc. are performed on the single-level cells in response to addresses corresponding to the single-level cells and a command for the single-level cells. Operations such as a program operation, a read operation, etc. are performed on the multi-level cells in response to addresses corresponding to the multi-level cells and a command for the multi-level cells. A conventional flash memory device including single-level cells and multi-level cells as described above will be described with reference to FIG. 2.

FIG. 2 is a block diagram of a conventional semiconductor memory device, that is, a conventional flash memory device 10. As shown in FIG. 2, the conventional flash memory device 10 may include a command decoder 11, a command flag generation unit 12, a logic circuit for SLCs 13, a logic circuit for MLCs 14, a memory controller 15, and a memory cell array 16. An SLC command for programming or reading of single-level cells or an MLC command for programming or reading of multi-level cells is input to the command decoder 11. Some of the memory cells 16 are single-level cells and the others are multi-level cells.

The command decoder 11 receives a command provided by an external host (not shown) and decodes the command. The decoded command is provided to the command flag generation unit 12.

In response to the decoded command, the command flag generation unit 12 outputs a signal for enabling one of the logic circuit for SLCs 13 and the logic circuit for MLCs 14. For example, when the command received by the command flag generation unit 12 is an SLC command, the command flag generation unit 12 activates and outputs a signal EN1 in order to enable the logic circuit for SLCs 13. When the command received by the command flag generation unit 12 is an MLC command, the command flag generation unit 12 activates and outputs a signal EN2 in order to enable the logic circuit for MLCs 14.

When the SLC logic circuit 13 is enabled by the activated signal EN1, the SLC logic circuit 13 provides to the memory controller 15 a control signal C1 that is generated due to a series of operations for driving the single-level cells among the memory cells 16. The memory controller 15 generates various voltage signals (not shown) and control signals C3 and provides the generated signals C3 to the memory cells 16. In this case, the signals C3 are used to drive the single-level cells of the memory cells 16.

On the other hand, when the command received by the command flag generation unit 12 is an MLC command, a signal EN2 is activated and the MLC logic circuit 13 is enabled by the activated signal EN2. The MLC logic circuit 14 provides to the memory controller 15 a control signal C2 that is generated due to a series of operations for driving the multi-level cells among the memory cells 16. The memory controller 15 generates and provides various voltage signals (not shown) and control signals C3 to the memory cells 16. In this case, the signals C3 are used to drive the multi-level cells of the memory cells 16.

In the conventional flash memory device 10 constructed as described above, addresses corresponding to multi-level cells may be input even though a command for single-level cells is input, or addresses corresponding to single-level cells may be input even though a command for multi-level cells is input. Alternatively, when one single-level cell block including 64 pages is driven, wrong addresses deviating from an address range for the pages may be input. In these cases, the conventional flash memory device 10 may malfunction or may be unable to operate. However, in the prior art, these problems cannot be solved.

SUMMARY OF THE INVENTION

The present invention provides a semiconductor memory device capable of addressing a malfunction or a non-operation by performing an error control operation according to an externally received command and an externally received address, and a method of driving the semiconductor memory device.

According to an aspect of the present invention, there is provided a semiconductor memory device including a memory cell array having a single-level cell area and a multi-level cell area, a command decoder which receives a command from an external source and decodes the command, an area determination unit which receives an address from an external source and determines whether a memory cell corresponding to the address belongs to either the single-level cell area or the multi-level cell area, a command flag generation unit which generates at least one enable control signal according to the decoded command and the determination result, and a logic circuit which generates a control signal for driving the memory cells included in the memory cell array or performs an error control operation, in response to the enable control signal.

The logic circuit may include a first logic circuit which generates a control signal for driving the single-level cells, in response to a first enable control signal output from the command flag generation unit, and a second logic circuit which generates a control signal for driving the multi-level cells, in response to a second enable control signal output from the command flag generation unit.

The logic circuit may further include an error control logic circuit which performs an error control operation in response to a third enable control signal output from the command flag generation unit.

Each of the first logic circuit, the second logic circuit, and the error control logic circuit may include a state machine.

In one embodiment, when the received command is for the single-level cells and the received address corresponds to the single-level cell area, the command flag generation unit activates and outputs the first enable control signal. When the received command is for the multi-level cells and the received address corresponds to the multi-level cell area, the command flag generation unit activates and outputs the second enable control signal.

In one embodiment, the command flag generation unit activates and outputs the third enable control signal when a memory cell to be driven according to the received command and a memory cell corresponding to the received address belong to different areas.

In one embodiment, after performing the error control operation, the error control logic circuit activates and outputs a flag signal in order to provide to the outside information representing that the semiconductor memory device is in a command-waiting state.

The semiconductor memory device may further include a storage unit which stores information about addresses of the single-level cell area and multi-level cell area and provides the address information to the area determination unit.

The semiconductor memory device may further include a storage unit that is connected to the error control logic circuit and stores the error generation information provided by the error control logic circuit.

The memory cell array may be a flash memory cell array.

According to another aspect of the present invention, there is provided a semiconductor memory device including a memory cell array having a single-level cell area and a multi-level cell area, a command decoder which receives a command from an external source and decodes the command, an area determination unit which receives an address from an external source, determines whether the received address is within a block number range or page number range corresponding to the memory cell array, and outputs a determination signal, a command flag generation unit which generates at least one enable control signal in response to the decoded command and the determination signal, and a logic circuit which generates a control signal for driving memory cells included in the memory cell array or performs an error control operation, in response to the enable control signal.

In one embodiment, the logic circuit comprises: a first logic circuit which generates a control signal for driving the single-level cells, in response to a first enable control signal output from the command flag generation unit; and a second logic circuit which generates a control signal for driving the multi-level cells, in response to a second enable control signal output from the command flag generation unit.

In one embodiment, the logic circuit further comprises an error control logic circuit which performs an error control operation in response to a third enable control signal output from the command flag generation unit.

The single-level cell area may include m pages for each block, and the multi-level cell area may include n pages for each block, wherein m and n denote integers. The area determination unit may determine whether the page number of the received address exists within a page number range of a corresponding block of the memory cell array.

In one embodiment, when the page number of the received command is within the page number range of a corresponding block, the command flag generation unit may activate and output one of the first and second enable control signals. When the page number of the received command is out of the page number range of a corresponding block, the command flag generation unit may activate and output the third enable control signal.

In one embodiment, the memory cell array is a flash memory cell array.

According to another aspect of the present invention, there is provided a method of driving a semiconductor memory device comprising a memory cell array that comprises a single-level cell area and a multi-level cell area, the method including: receiving a command and an address from external sources; determining whether a memory cell corresponding to the address belongs to either the single-level cell area or the multi-level cell area; generating at least one enable control signal according to the command and the determination result; and generating a control signal for driving the memory cells included in the memory cell array or performing an error control operation, in response to the enable control signal.

In one embodiment, in the generating of the at least one enable control signal, when the received command is for the single-level cells and the received address corresponds to the single-level cell area, the first enable control signal is activated and output, and when the received command is for the multi-level cells and the received address corresponds to the multi-level cell area, the second enable control signal is activated and output.

In one embodiment, in the generating of the at least one enable control signal, when a memory cell to be driven according to the received command and a memory cell corresponding to the received address belong to different areas, the third enable control signal is activated and output.

In one embodiment, the generating of the control signal or the performing of the error control operation comprises enabling one of a state machine for single-level cells, a state machine for multi-level cells, and a state machine for error control in response to the first through third enable control signals.

In one embodiment, the method further comprises activating and outputting a flag signal in order to provide to the outside information that represents that the semiconductor memory device is in a command-waiting state, after performing the error control operation.

According to another aspect of the present invention, there is provided a method of driving a semiconductor memory device comprising a memory cell array that comprises a single-level cell area and a multi-level cell area, the method including: receiving a command and an address from external sources; determining whether the received address is within a block number range or page number range corresponding to the memory cell array; generating at least one enable control signal in response to the command and the determination signal; and generating a control signal for driving memory cells included in the memory cell array or performing an error control operation, in response to the enable control signal.

In one embodiment, the generating of the at least one enable control signal comprises: activating and outputting the first enable control signal or the second enable control signal when it is determined that the received address is within the page number range; and activating and outputting the third enable control signal when it is determined that the received address is out of the page number range.

In one embodiment, the generating of the control signal or performing of the error control operation comprises enabling one of a state machine for single-level cells, a state machine for multi-level cells, and a state machine for error control in response to the first through third enable control signals.

In one embodiment, the performing of the error control operation further comprises activating and outputting a flag signal in order to provide to the outside information that represents that the semiconductor memory device is in a command waiting state, after performing the error control operation.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1A:
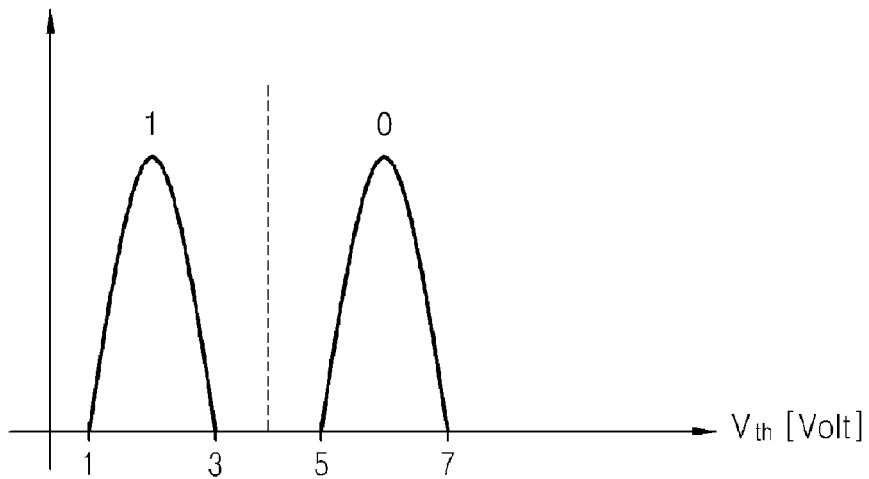
FIG. 1A is a graph showing a data state in a single-level cell versus a threshold voltage.
Figure 1B:
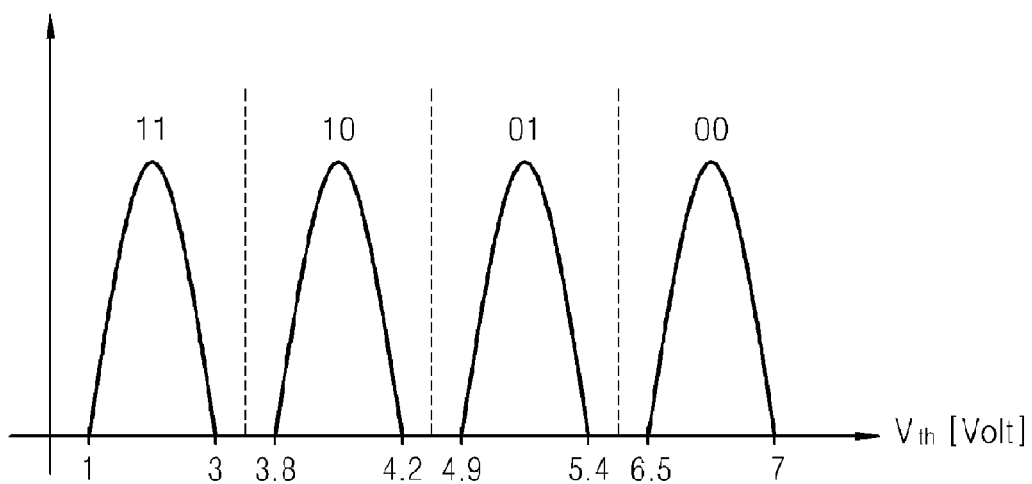
FIG. 1B is a graph showing a data state in a multi-level cell versus a threshold voltage.
Figure 2:
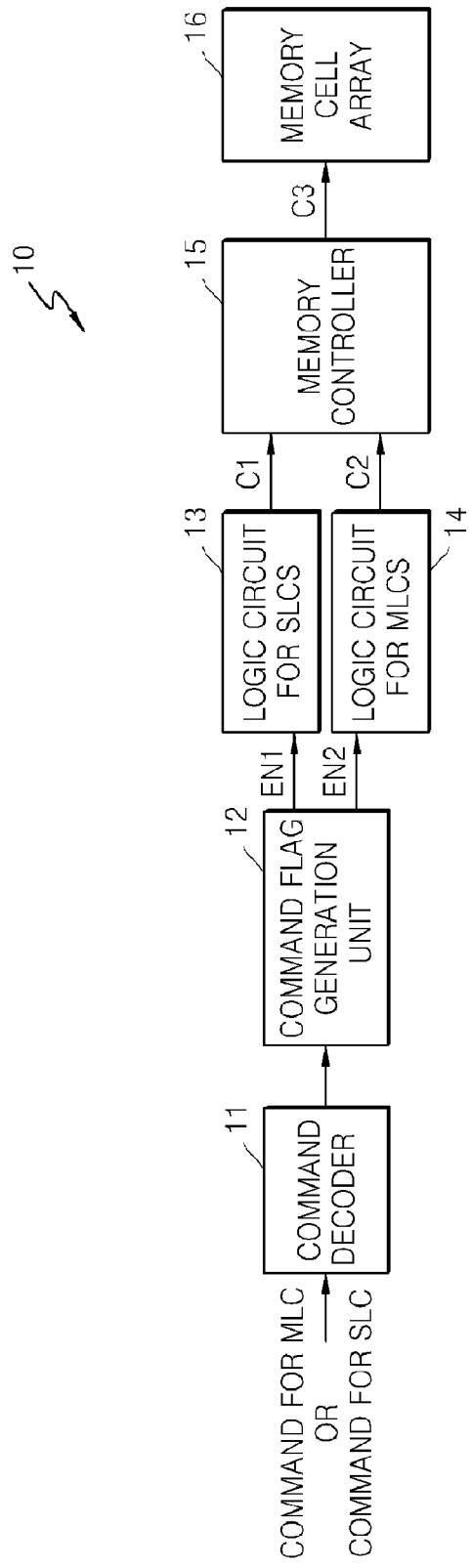
FIG. 2 is a block diagram of a conventional semiconductor memory device.
Figure 3:
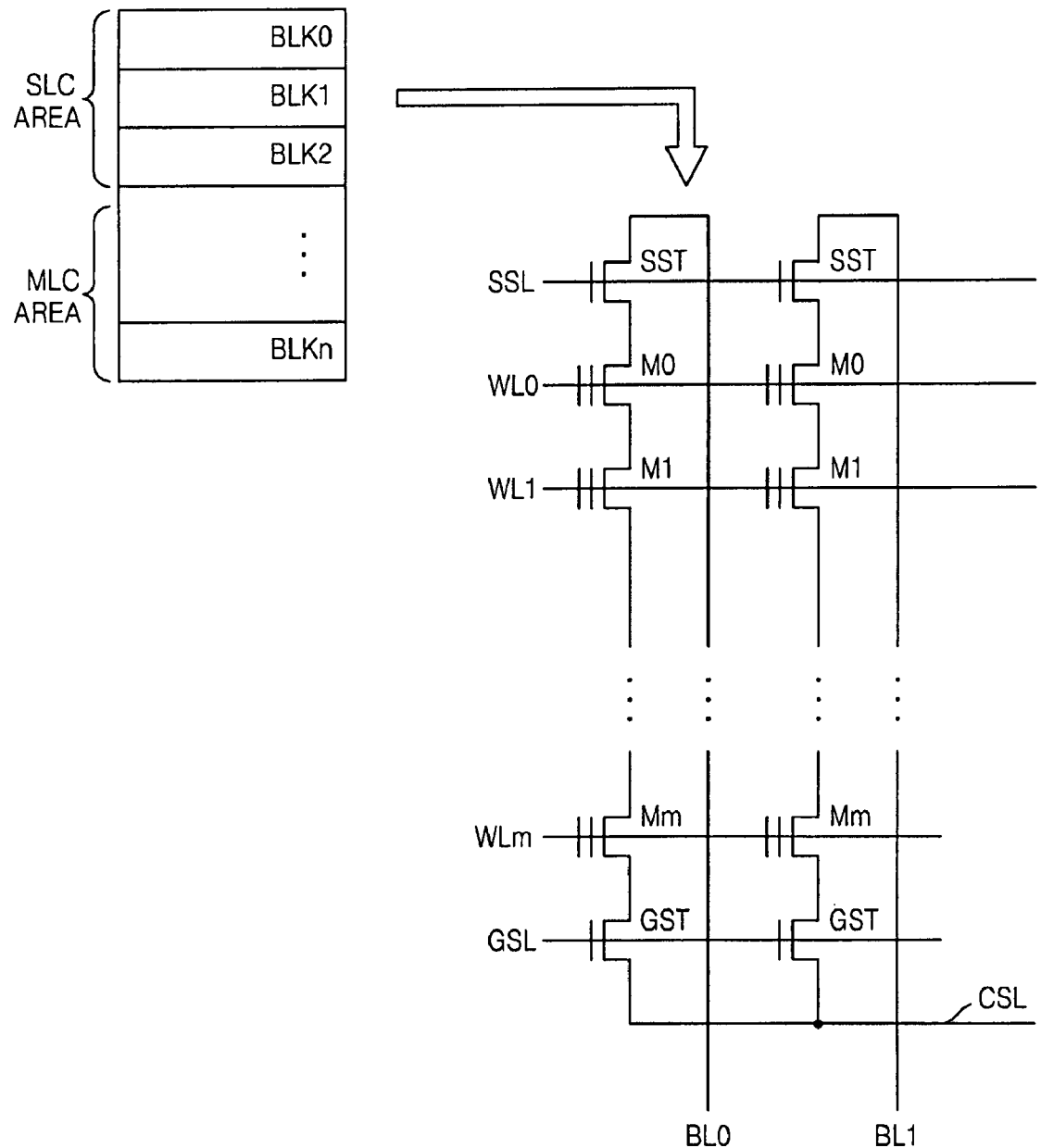
FIG. 3 is a block diagram of a memory cell array applied to a semiconductor memory device according to the present invention.

FIG. 3 is a block diagram of a memory cell array applied to a semiconductor memory device according to the present invention. As shown in FIG. 3, the memory cell array, that is, an array of non-volatile memory cells such as flash memory cells, includes at least one block.

Among the at least one memory block, some blocks BLK0 through BLK2 may be single-level cells, and the other blocks BLK3 through BLKn may be multi-level cells. The single-level memory cells and the multi-level memory cells use different programming/reading methods. Thus, a command for driving the single-level cells and a command for driving the multi-level cells are different from each other.

Each of the memory blocks included in the memory cell array may include a plurality of strings, each of which may include a string selection transistor SST, at least one memory cell M0 through Mm, and a ground selection transistor GST. A string selection line SSL is connected to a gate of the string selection transistor SST, and word lines WL1 through WLm are respectively connected to gates of the memory cells M0 through Mm. A ground selection line GSL is connected to a gate of the ground selection transistor GST. Bitlines BL0 and BL1 are respectively connected to electrodes of the string selection transistors SST included in the strings. A common source line CSL is commonly connected to electrodes of the ground selection transistors GST.

As described above, the memory cell array may include a single-level cell area and a multi-level cell area, and a command for driving the single-level cells and a command for driving the multi-level cells are different. When the semiconductor memory device is driven, when addresses corresponding to multi-level cells are received when a command for single-level cells is input, or when addresses corresponding to single-level cells are received when a command for multi-level cells is input, the semiconductor memory device may malfunction, or the system thereof may be down, or other problems may occur.

Figure 4:
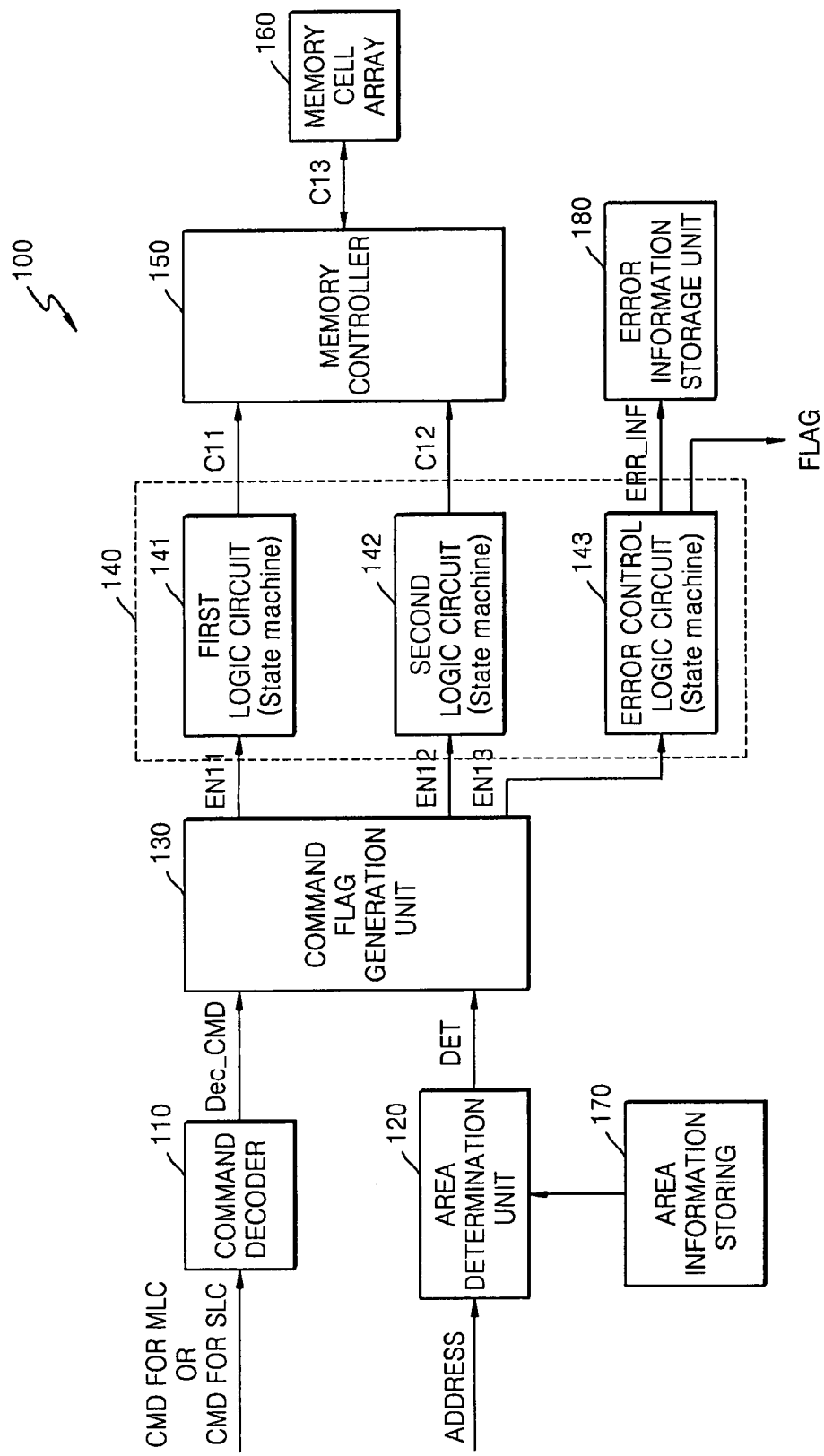
FIG. 4 is a block diagram of a semiconductor memory device according to an embodiment of the present invention.

FIG. 4 is a block diagram of a semiconductor memory device 100 according to an embodiment of the present invention. As shown in FIG. 4, the semiconductor memory device 100 may include a command decoder 110, an area determination unit 120, a command flag generation unit 130, a logic circuit 140, a memory controller 150, and a memory cell array 160. An area of the memory cell array 160 includes single-level cells and the other area includes multi-level cells.

The command decoder 110 receives a command CMD for single-level cells SLC or a command CMD for multi-level cells MLC from an external source. The command decoder 110 decodes the received command and provides the decoded command Dec_CMD to the command flag generation unit 130.

The area determination unit 120 receives an address ADDRESS from an external source and determines whether a memory cell corresponding to the address ADDRESS belongs to a single-level cell area or a multi-level cell area of the memory cell array 160. The area determination unit 120 provides a determination signal DET obtained by the determination to the command flag generation unit 130.

Preferably, the semiconductor memory device 100 may further include an area information storing unit 170 for storing address information about the single-level cell area of the memory cell array 160 and address information about the multi-level cell area of the memory cell array 160. Any of various types of storage can be used as the area information storing unit 170. For example a register may be used as the storage. When determining the area of the received address ADDRESS, the area determination unit 120 may use the address information about the single-level cell area and the address information about the multi-level cell area that is stored in the area information storing unit 170. The command flag generation unit 130 receives the command Dec_CMD from the command decoder 110 and the determination signal DET from the area determination unit 120. The command flag generation unit 130 generates at least one of first through third enable control signals EN11 through EN13 in response to the decoded command Dec_CMD and the determination signal DET.

Preferably, the command flag generation unit 130 generates the first through third enable control signals EN11 through EN13 and activates and outputs one of the first through third enable control signals EN11 through EN13 in response to the decoded command Dec_CMD and the determination signal DET. When the command received by the CMD decoder 110 is a command CMD for single-level cells SLC and the address ADDRESS received by the area determination unit 120 corresponds to the single-level cell area, the command flag generation unit 130 activates and outputs the first enable control signal EN11. When the command received by the CMD decoder 110 is a command CMD for MLC and the address ADDRESS received by the area determination unit 120 corresponds to the MLC area, the command flag generation unit 130 activates and outputs the second enable control signal EN12. However, when the received command is the command CMD for SLC and the received address ADDRESS corresponds to the MLC area, or when the received command is the command CMD for MLC and the received address ADDRESS corresponds to the MLC area, the command flag generation unit 130 activates and outputs the third enable control signal EN13.

In this way, one of the first through third enable control signals EN11 through EN13 is activated, and the first through third enable control signals EN11 through EN13 are provided to the logic circuit 140. In response to the first through third enable control signals EN11 through EN13, the logic circuit 140 generates control signals C11 and C12 for driving the memory cells or performs an error control operation.

The logic circuit 140 may include a first logic circuit 141, which generates the control signal C11 for driving single-level cells, and a second logic circuit 142, which generates the control signal C12 for driving multi-level cells. The first enable control signal EN11 output from the command flag generation unit 130 is provided to the first logic circuit 141, and the second enable control signal EN12 output from the command flag generation unit 130 is provided to the second logic circuit 142.

When the semiconductor memory device 100 does not receive an appropriate address corresponding to the received command, for example, when a command for driving single-level cells has been received but the received address corresponds to the MLC area, the semiconductor memory device 100 may malfunction. In order to prevent this malfunction, the logic circuit 140 may further include an error control logic circuit 143. The third enable control signal EN13 output from the command flag generation unit 130 is provided to the error control logic circuit 143. Preferably, each of the first logic circuit 141, the second logic circuit 142, and the error control logic circuit 143 may include a state machine.

When a command for driving single-level cells and an address corresponding to the single-level cell area are received by the semiconductor memory device 100, the command flag generation unit 130 activates and outputs the first enable control signal EN11. The first logic circuit 141 for driving the single-level cells is enabled in response to the activated first enable control signal EN11. The first logic circuit 141 provides the control signal C11 to the memory controller 150. The memory controller 150 provides various voltage signals and control signals C13 to the memory cell array 160. Accordingly, memory cells that belong to the single-level cell of the memory cell array 160 are driven according to the received command.

On the other hand, when a command for driving multi-level cells and an address corresponding to the multi-level cell area are received by the semiconductor memory device 100, the command flag generation unit 130 activates and outputs the second enable control signal EN12. The second logic circuit 142 is enabled in response to the activated second enable control signal EN12. The second logic circuit 142 provides the control signal C12 to the memory controller 150. The memory controller 150 provides the various voltage signals and control signals C13 to the memory cell array 160 under the control of the control signal C12.

On the other hand, as described above, when the received command is the command for SLC and the received address ADDRESS corresponds to the multi-level cell area or when the received command is the command for MLC and the received address ADDRESS corresponds to the single-level cell area, the third enable control signal EN13 is activated, and the error control logic circuit 143 is enabled in response to the activated third enable control signal EN13. In this case, the first enable control signal EN11 and the second enable control signal EN12 are inactivated and the first logic circuit 141 and the second logic circuit 142 are disabled. In other words, when a command or address for driving a memory cell array does not belong to a normal operation range, the first logic circuit 141 and the second logic circuit 142 are disabled, and thus it is impossible to prevent a malfunction of the semiconductor memory device 100.

Preferably, the error control logic circuit 143 may generate a flag signal used to inform the outside that an operation mode corresponding to the received command has been concluded. More specifically, the error control logic circuit 143 is enabled by the third enable control signal EN13, and after a predetermined period of time, the error control logic circuit 143 activates and outputs the flag signal. The semiconductor memory device 100 provides a state signal (not shown) representing the conclusion state of a current operation mode to the outside. The level of the state signal transits when the flag signal is activated. By providing the level-transited state signal to the outside, the outside is informed of the conclusion of an operation mode corresponding to the received command is indicated. By providing information representing the conclusion of the operation mode to the outside as described above and keeping a command-waiting state, impossibility of a system operation can be prevented.

In order to store information representing that an error has occurred to an operation of the semiconductor memory device 100 when a command or address does not belong to a normal operation range as mentioned above, the semiconductor memory device 100 may further include an error information storing unit 180, which may be a register. The error information storage unit 180 is connected to the error control logic circuit 143. When the error control logic circuit 143 is enabled, the error information storage unit 180 stores error generation information ERR_INF provided from the error control logic circuit 143.

As described the above, the area determination unit 120 receives the address ADDRESS from the external source and determines whether a memory cell corresponding to the address ADDRESS belongs to the single-level cell area or multi-level cell area of the memory cell array 160. The area determination unit 120 may also determine whether the received address ADDRESS belongs to either an address range corresponding to the single-level cell area or an address range corresponding to the multi-level cell area, and output the determination signal DET depending on the result of the determination.

For example, each of the memory blocks corresponding to the single-level cells may include 64 pages. Each of the memory blocks corresponding to the multi-level cells may include more than 64 pages. When each multi-level cell stores 2-bit data, each of the memory blocks corresponding to the multi-level cells may include 128 pages.

The area information storage unit 170 may store the numbers of the memory blocks for the single level cells, the numbers of the pages included in each of the memory blocks for the single-level cells, the numbers of the memory blocks for the multi-level cells, and the numbers of the pages included in each of the memory blocks for the multi-level cells.

The area determination unit 120 determines whether the received address ADDRESS belongs to a normal block number range or a normal page number range, by using address information stored in the area information storage unit 170. For example, when an address ADDRESS corresponding to an SLC block having pages No. 0 through 63 is received, it is determined whether the page number corresponding to the received address ADDRESS belongs to the page number range of No. 0 to No. 63. The area determination unit 120 outputs a determination signal DET having different values according to the results of the determination.

When the received address ADDRESS is within the page range, the command flag generation unit 130 activates and outputs the first enable control signal EN11 or the second enable control signal EN12. When the received address ADDRESS is out of the page range, the command flag generation unit 130 activates and outputs the third enable control signal EN13.

Figure 5:
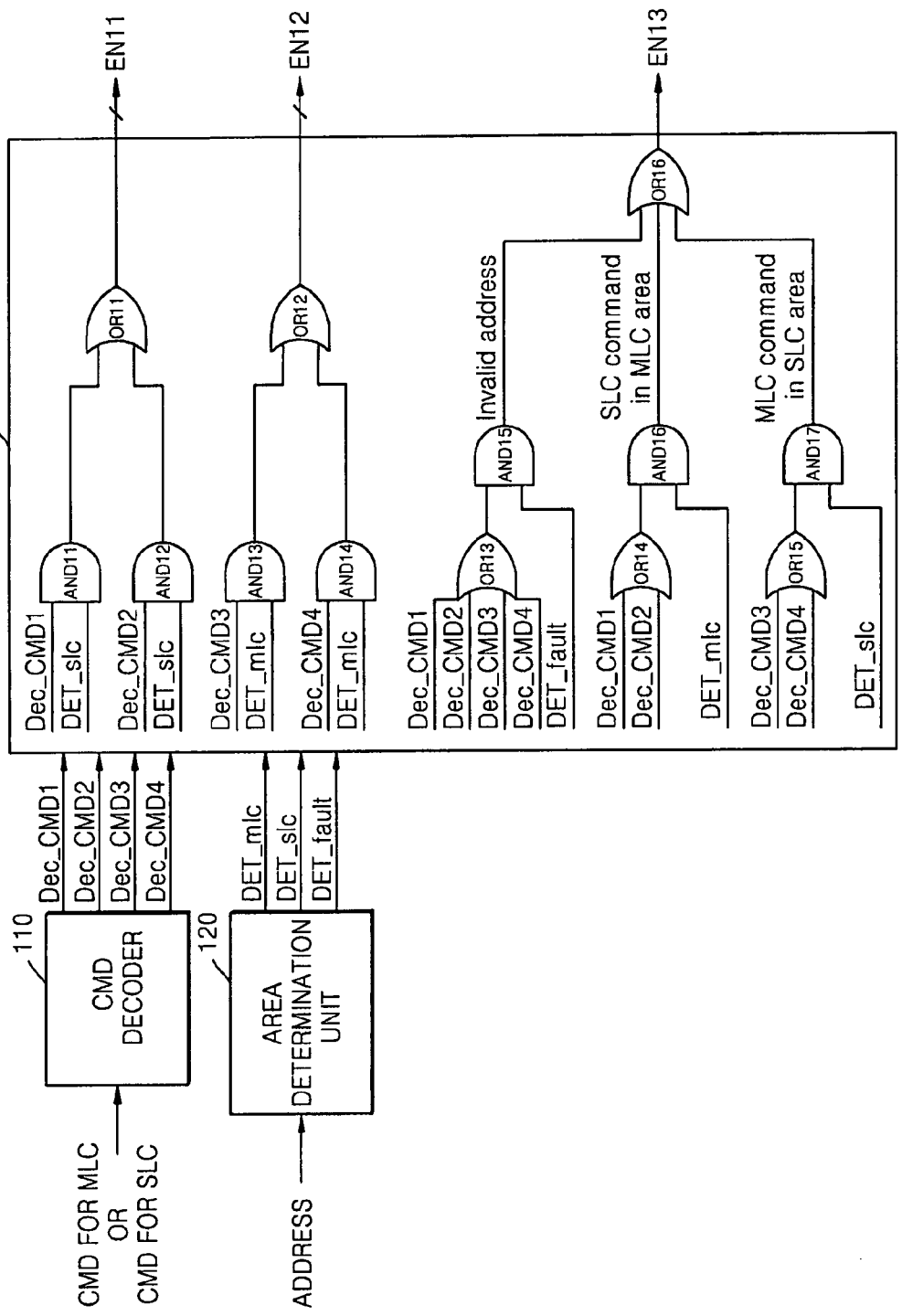
FIG. 5 is a circuit diagram of a command flag generation unit shown in FIG. 4.

FIG. 5 is a circuit diagram of one embodiment of the command flag generation unit 130 shown in FIG. 4. The command flag generation unit 130 may be implemented using at least one logical device. In FIG. 5, the command flag generation unit 130 includes a plurality of AND gates AND11 through AND17 and a plurality of OR gates OR11 through OR16.

The command decoder 110 receives the command CMD for SLCs or the command CMD for MLCs from an external source, decodes the received command CMD, and outputs decoded signals Dec_CMD1 through Dec_CMD4. The area determination unit 120 receives the address ADDRESS from an external source and outputs determination signals DET_slc, DET_mlc, and DET_fault depending on the result of an area determination. The command flag generation unit 130 receives the decoded signal Dec_CMD1 through Dec_CMD4 and the determination signals DET_slc, DET_mlc, and DET_fault, and performs logic operations on the received signals to generate the first through third enable control signals EN11 through EN13.

Operation of the semiconductor memory device 100 constructed as illustrated in FIGS. 4 and 5 will now be described by referring to FIGS. 6 through 8.

Figure 6:
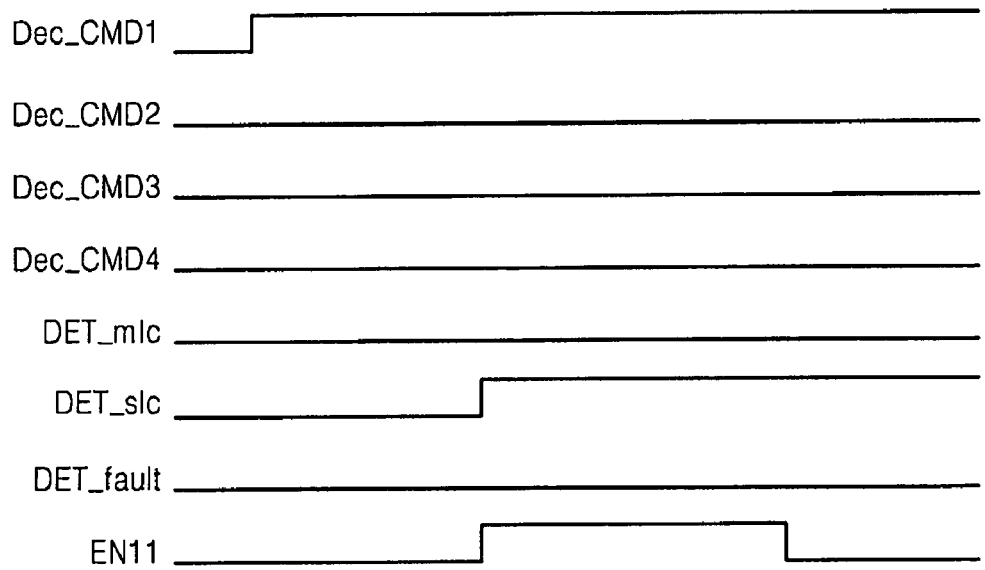
FIG. 6 is a waveform diagram of a first example of operation of the semiconductor memory device shown in FIG. 4.

FIG. 6 is a waveform diagram of a first example of the operation of the semiconductor memory device 100, and in particular illustrates when a normal command and a normal address ADDRESS are received by the semiconductor memory device 100.

Among the signals Dec_CMD1 through Dec_CMD4 obtained by decoding the received command, the signals Dec_CMD1 and Dec_CMD2 are signals for driving the single-level cells, and the signals Dec_CMD3 and Dec_CMD4 are signals for driving the multi-level cells. The determination signal DET_slc represents that the received address ADDRESS corresponds to the single-level cell area of the memory cell array 160, and the determination signal DET_mic represents that the received address ADDRESS corresponds to the multi-level cell area of the memory cell array 160. The determination signal DET_fault is activated when an error exists in the externally received address ADDRESS, for example, when the received address ADDRESS is out of the address range corresponding to the single-level cell area or to the multi-level cell area.

As shown in FIG. 6, the signal Dec_CMD1 is activated in response to a command for driving single-level cells. The determination signal DET_slc is activated when it is determined that the received address ADDRESS corresponds to the single-level cell area.

The signal Dec_CMD1 and the determination signal DET_sic are input to two input terminals of the AND gate AND11 of FIG. 5. Accordingly, the output signal of the AND gate AND11 transits to a high level and the first enable control signal EN11 is activated by the OR gate OR11. On the other hand, the output of inactivated signals is maintained by the AND gates AND12 through AND17. Thus, the second enable control signal EN12 and the third enable control signal EN13 are inactivated by the OR gates OR12 through OR16.

In this case, when the first enable control signal EN11 is activated, the first logic circuit 141 for driving single-level cells is enabled, and the second logic circuit 142 and the error control logic circuit 143 are disabled. Although not shown in the drawings, the logic circuit 141 may generate a flag signal representing completion of a normal operation, after controlling the memory controller 150 according to the received command. Preferably, the first enable control signal EN11 may transit to an inactivated state in response to the flag signal.

Figure 7:
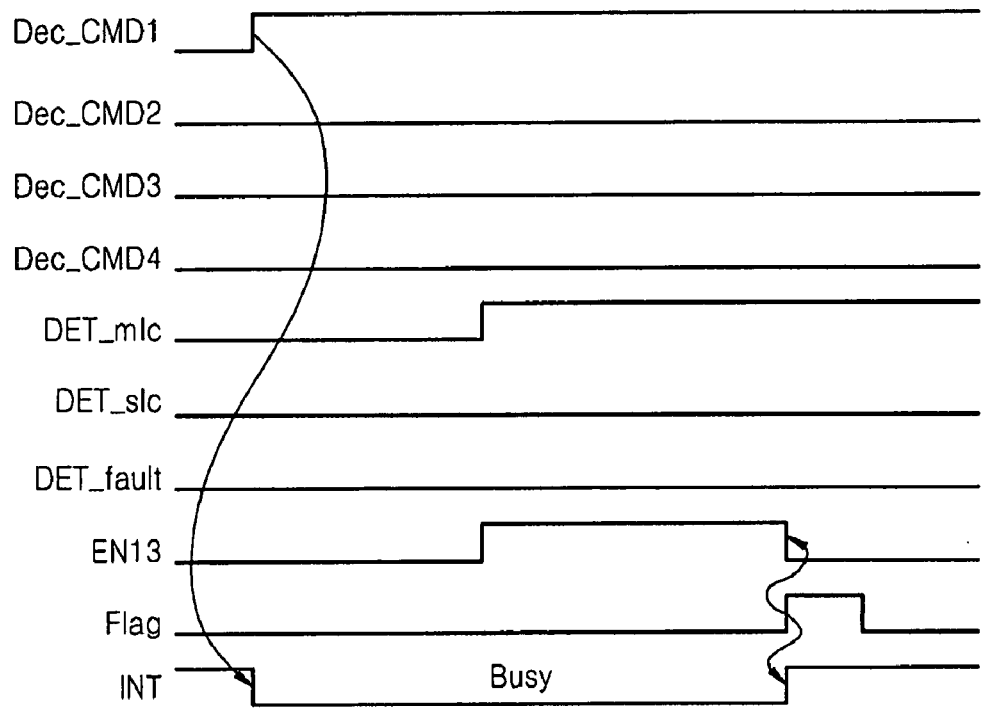
FIG. 7 is a waveform diagram of a second example of operation of the semiconductor memory device shown in FIG. 4.

FIG. 7 is a waveform diagram of a second example of the operation of the semiconductor memory device 100 shown in FIG. 4, and in particular illustrates when the semiconductor memory device 100 receives a command for driving multi-level cells and an address ADDRESS corresponding to single-level cells.

As shown in FIG. 7, the signal Dec_CMD1 is activated in response to a command for driving single-level cells. The determination signal DET_mlc is activated when it is determined that the received address ADDRESS corresponds to the multi-level cell area.

As the signal Dec_CMD1 and the determination signal DET_mlc are activated, the output signals of the OR gates OR13 and OR14 of FIG. 5 transit to a high level. As the determination signal DET_mlc is activated, the output signal of the AND gate AND16 which receives an output signal of the OR gate OR14 and the determination signal DET_mlc transits to a high level. Accordingly, the third enable control signal EN13 is activated by the OR gate OR16. On the other hand, the output of the inactivated signal is maintained by the AND gates AND11 through AND14. Thus, the first enable control signal EN11 and the second enable control signal EN12 are inactivated by the OR gates OR11 and OR12.

In this case, as the third enable control signal EN13 is activated, the error control logic circuit 143 for performing an error control operation is enabled. On the other hand, the first logic circuit 141 for driving single-level cells and the second logic circuit 142 for driving multi-level cells are disabled.

After performing an operation, such as, storage of error generation information ERR_INF in the error information storage unit 180, the error control logic circuit 143 may generate the flag signal that represents conclusion of the operation. Preferably, the third enable control signal EN13 is transited to an inactivated state in response to the flag signal Flag. Preferably, the level of a state signal INT representing the operation state of the semiconductor memory device 100 is transited in response to the flag signal Flag. The transited state signal INT is provided to the outside in order to inform a host (not shown) that the operation according to the received command is completed and the semiconductor memory device 100 is in a command-waiting state.

Figure 8:
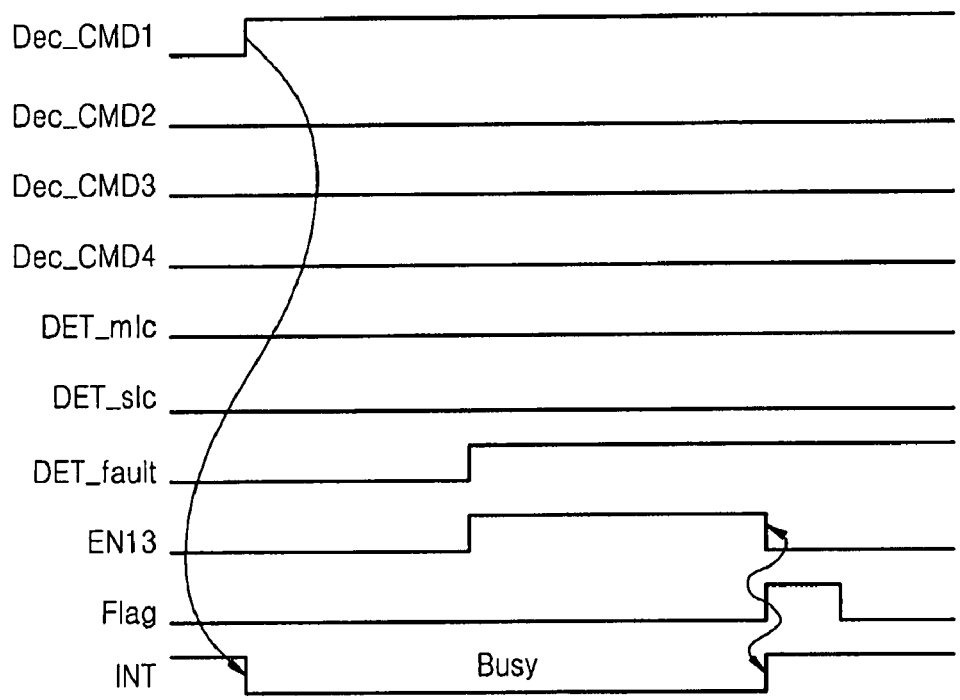
FIG. 8 is a waveform diagram of a third example of operation of the semiconductor memory device shown in FIG. 4.

FIG. 8 is a waveform diagram of a third example of the operation of the semiconductor memory device 100 shown in FIG. 4, and in particular illustrates when the address ADDRESS provided to the semiconductor memory device 100 is out of the normal address range.

As shown in FIG. 8, the signal Dec_CMD1 is activated in response to a command for driving single-level cells. The area determination unit 120 detects that the received address ADDRESS is out of the normal address range, and thus inactivates the determination signal DET_slc and DET_mic and activates the determination signal DET_fault.

As signals as described above are input to the command flag generation unit 130, the AND gates AND11 through AND14 maintain the output of the inactivated signals. Accordingly, the first enable control signal EN11 and the second enable control signal EN12 are inactivated by the OR gates OR11 and OR12.

On the other hand, output signals of the OR gates OR13 and OR14 are activated in response to the activated signal Dec_CMD1. An output signal of the AND gate AND15 is activated by the activated determination signal DET_fault. Accordingly, the third enable control signal EN13 is activated by the OR gate OR16. The error control logic circuit 143 is enabled by the activated third enable control signal EN13, and the first and second logic circuits 141 and 142 for driving the memory cells are disabled.

Figure 9:
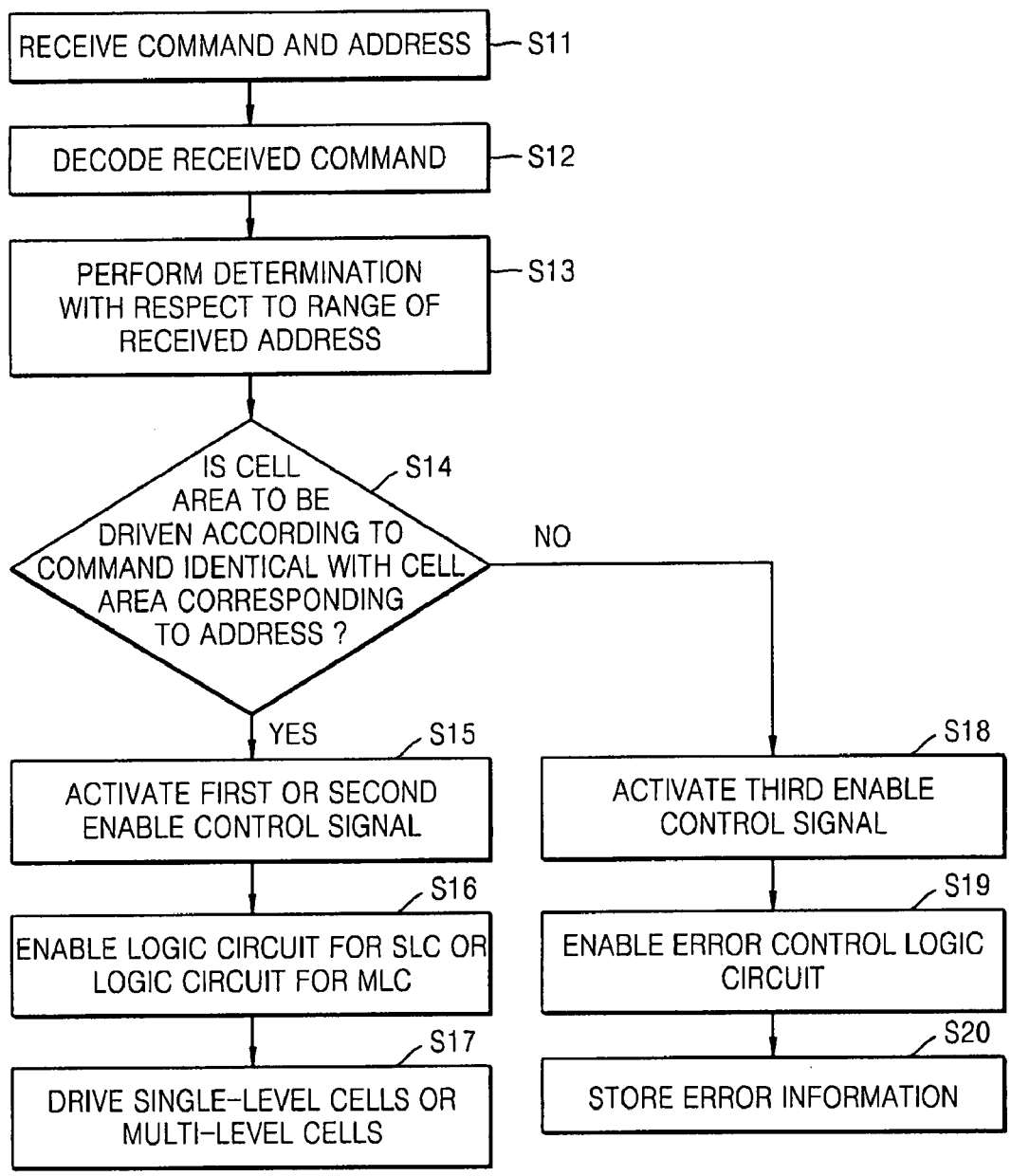
FIG. 9 is a flowchart of a method of driving a semiconductor memory device according to an embodiment of the present invention.

FIG. 9 is a flowchart of a method of driving the semiconductor memory device 100, according to an embodiment of the present invention. As shown in FIG. 9, in step S11, a command and an address output from an external host are input to the semiconductor memory device 100. In step S12, the semiconductor memory device 100 performs a decoding operation on the received command.

In step S13, a determination with respect to the range of the address received together with the command is performed. More specifically, it is determined whether a memory cell corresponding to the address belongs either to the single-level cell area or the multi-level cell area of the memory cell array.

Thereafter, in step S14, it is determined using the decoded command and the result of the determination in step S13 whether a cell area that is to be driven according to the command is identical with the cell area corresponding to the address. More specifically, it is determined whether both an address corresponding to the single-level cell area and the command for driving single-level cells are received. Alternatively, it is determined whether both an address corresponding to the multi-level cell area and the command for driving multi-level cells are received.

When it is determined in step S14 that the cell area that is to be driven according to the command is identical with the cell area corresponding to the address, the first or second enable control signal is activated, in step S15. More specifically, when the received command is a command for driving single-level cells and the received address corresponds to the single-level area, the first enable control signal is activated. When the received command is a command for driving multi-level cells and the received address corresponds to the multi-level cell area, the second enable control signal is activated.

Thereafter, as the first or second enable control signal is activated, the logic circuit for single-level cells (for example, which is implemented as a state machine) or the logic circuit for multi-level cells is enabled, in step S16. As the logic circuit for single-level cells or the logic circuit for multi-level cells is enabled, the single-level cells or the multi-level cells are driven, in step S17.

On the other hand, when it is determined in step S14 that the cell area that is to be driven according to the command is different from the cell area corresponding to the address, the third enable control signal is activated, in step S18. Then, in step S19, as the third enable control signal is activated, the error control logic circuit is enabled. In step S20, as the error control logic circuit is enabled, the error generation information is stored in a predetermined memory unit. Preferably, the error control logic circuit generates a flag signal after an error control operation is properly concluded. The level of the state signal representing an operation mode state of the semiconductor memory device 100 is transited in response to the activated flag signal.

Although the determination illustrated in FIG. 9 is as to whether an area corresponding to the received address belongs to a single-level cell area or a multi-level cell area, the present invention is not limited thereto. In determining the area, as shown in FIG. 5, a determination may be made as to whether the number of the received address belongs to the number range of the blocks included in the memory cell array and to the number range of the pages for each block.

A semiconductor memory device according to the present invention as mentioned above performs an error control operation when an error exists in an externally received command and an externally received address. Thus, a malfunction of the semiconductor memory device or a system operation disability can be addressed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device comprising:
a memory cell array comprising a single-level cell area and a multi-level cell area;

a command decoder which receives a command from an external source and decodes the command;

an area determination unit which receives an address from an external source and determines whether a memory cell corresponding to the address belongs to either the single-level cell area or the multi-level cell area;

a command flag generation unit which generates at least one enable control signal according to the decoded command and the determination result; and a logic circuit which generates a control signal for driving the memory cells included in the memory cell array or performs an error control operation, in response to the enable control signals, wherein the logic circuit comprises:

a first logic circuit which generates a control signal for driving the single-level cells, in response to a first enable control signal output from the command flag generation unit;

a second logic circuit which generates a control signal for driving the multi-level cells, in response to a second enable control signal output from the command flag generation unit; and an error control logic circuit which performs an error control operation in response to a third enable control signal output from the command flag generation unit.

2. The semiconductor memory device of claim 1, wherein each of the first logic circuit, the second logic circuit, and the error control logic circuit comprises a state machine.

3. The semiconductor memory device of claim 1, wherein:

when the received command is for the single-level cells and the received address corresponds to the single-level cell area, the command flag generation unit activates and outputs the first enable control signal; and when the received command is for the multi-level cells and the received address corresponds to the multi-level cell area, the command flag generation unit activates and outputs the second enable control signal.

4. The semiconductor memory device of claim 3, wherein the command flag generation unit activates and outputs the third enable control signal when a memory cell to be driven according to the received command and a memory cell corresponding to the received address belong to different areas.

5. The semiconductor memory device of claim 1, wherein after performing the error control operation, the error control logic circuit activates and outputs a flag signal in order to provide to the outside information representing that the semiconductor memory device is in a command-waiting state.

6. The semiconductor memory device of claim 1, further comprising a storage unit which stores information about addresses of the single-level cell area and multi-level cell area and provides the address information to the area determination unit.

7. The semiconductor memory device of claim 1, further comprising a storage unit that is connected to the error control logic circuit and stores the error generation information provided by the error control logic circuit.

8. The semiconductor memory device of claim 1, wherein the memory cell array is a flash memory cell array.

9. A semiconductor memory device comprising:

a memory cell array comprising a single-level cell area and a multi-level cell area;

a command decoder which receives a command from an external source and decodes the command;

an area determination unit which receives an address from an external source, determines whether the received address is within a block number range or page number range corresponding to the memory cell array, and outputs a determination signal;

a command flag generation unit which generates at least one enable control signal in response to the decoded command and the determination signal; and a logic circuit which generates a control signal for driving memory cells included in the memory cell array or performs an error control operation, in response to the enable control signal, wherein the logic circuit comprises:

a first logic circuit which generates a control signal for driving the single-level cells, in response to a first enable control signal output from the command flag generation unit;

a second logic circuit which generates a control signal for driving the multi-level cells, in response to a second enable control signal output from the command flag generation unit; and an error control logic circuit which performs an error control operation in response to a third enable control signal output from the command flag generation unit.

10. The semiconductor memory device of claim 9, wherein:

the single-level cell area comprises m pages for each block, and the multi-level cell area comprises n pages for each block, wherein m and n denote integers; and the area determination unit determines whether the page number of the received address exists within a page number range of a corresponding block of the memory cell array.

11. The semiconductor memory device of claim 10, wherein:

when the page number of the received command is within the page number range of a corresponding block, the command flag generation unit activates and outputs one of the first and second enable control signals; and when the page number of the received command is out of the page number range of a corresponding block, the command flag generation unit activates and outputs the third enable control signal.

12. The semiconductor memory device of claim 9, wherein the memory cell array is a flash memory cell array.

13. A method of driving a semiconductor memory device comprising a memory cell array that comprises a single-level cell area and a multi-level cell area, the method comprising:

receiving a command and an address from external sources;

determining whether a memory cell corresponding to the address belongs to either the single-level cell area or the multi-level cell area;

generating at least one enable control signal according to the command and the determination result; and generating a control signal for driving the memory cells included in the memory cell array or performing an error control operation, in response to the enable control signal, wherein in the generating of the at least one enable control signal, when the received command is for the single-level cells and the received address corresponds to the single-level cell area, the first enable control signal is activated and output, and when the received command is for the multi-level cells and the received address corresponds to the multi-level cell area, the second enable control signal is activated and output, and wherein in the generating of the at least one enable control signal, when a memory cell to be driven according to the received command and a memory cell corresponding to the received address belong to different areas, the third enable control signal is activated and output.

14. The method of claim 13, wherein the generating of the control signal or the performing of the error control operation comprises enabling one of a state machine for single-level cells, a state machine for multi-level cells, and a state machine for error control in response to the first through third enable control signals.

15. The method of claim 14, further comprising activating and outputting a flag signal in order to provide to the outside information that represents that the semiconductor memory device is in a command-waiting state, after performing the error control operation.

16. A method of driving a semiconductor memory device comprising a memory cell array that comprises a single-level cell area and a multi-level cell area, the method comprising:
receiving a command and an address from external sources;
determining whether the received address is within a block number range or page number range corresponding to the memory cell array;
generating at least one enable control signal in response to the command and the determination signal; and
generating a control signal for driving memory cells included in the memory cell array or performing an error control operation, in response to the enable control signal,
wherein the generating of the at least one enable control signal comprises:
activating and outputting the first enable control signal or the second enable control signal when it is determined that the received address is within the page number range; and
activating and outputting the third enable control signal when it is determined that the received address is out of the page number range,
wherein the generating of the control signal or performing of the error control operation comprises enabling one of a state machine for single-level cells, a state machine for multi-level cells, and a state machine for error control in response to the first through third enable control signals.

17. The method of claim 16, wherein the performing of the error control operation further comprises activating and outputting a flag signal in order to provide to the outside information that represents that the semiconductor memory device is in a command waiting state, after performing the error control operation.

* * * * *